(12) United States Patent
Chen et al.

(10) Patent No.: US 10,716,204 B2
(45) Date of Patent: Jul. 14, 2020

(54) KEYBOARD

(71) Applicant: CHICONY ELECTRONICS CO., LTD., New Taipei (TW)

(72) Inventors: Chih-Hao Chen, New Taipei (TW); Mitsuo Horiuchi, New Taipei (TW)

(73) Assignee: CHICONY ELECTRONICS CO., LTD., New Taipei (TW)

( * ) Notice: Subject to any disclaimer, the term of this patent is extended or adjusted under 35 U.S.C. 154(b) by 0 days.

(21) Appl. No.: 16/444,168

(22) Filed: Jun. 18, 2019

(65) Prior Publication Data

US 2020/0113040 A1 Apr. 9, 2020

Related U.S. Application Data

(60) Provisional application No. 62/740,963, filed on Oct. 4, 2018.

(30) Foreign Application Priority Data

Oct. 24, 2018 (TW) .............................. 107137596 A

(51) Int. Cl.
*H05K 1/00* (2006.01)
*H05K 1/02* (2006.01)
*H01H 13/7065* (2006.01)

(52) U.S. Cl.
CPC ......... *H05K 1/028* (2013.01); *H01H 13/7065* (2013.01); *H05K 2201/09063* (2013.01); *H05K 2201/10053* (2013.01)

(58) Field of Classification Search
USPC ........................................................ 361/749
See application file for complete search history.

(56) References Cited

U.S. PATENT DOCUMENTS

2017/0250035 A1* 8/2017 Lin ..................... H01H 13/70
2019/0221385 A1* 7/2019 Chang ................. H01H 13/84

* cited by examiner

*Primary Examiner* — Andargie M Aychillhum
(74) *Attorney, Agent, or Firm* — Muncy, Geissler, Olds & Lowe, P.C.

(57) ABSTRACT

The present application discloses a keyboard, which includes a base plate and a thin film circuit board. The base plate includes a first part, a second part and an inclined part. The first part has a first limiting portion and a second limiting portion, the second part has a third limiting portion. The thin film circuit board includes a first region, a second region and at least one connecting portion. The first region is located on the first part, and the first region has at least one opening. The first limiting portion and the second limiting portion are disposed in said opening. The second region is located on the second part, and the second region has at least one opening. The connecting portion is located on the inclined part, and the third limiting portion is passed through the opening of the second part and propped against the connecting portion.

16 Claims, 8 Drawing Sheets

KEYBOARD

This application claims priority of Application No. 107137596 filed in TAIWAN on 24 Oct. 2018 under 35 U.S.C. § 119; and this application claims priority of U.S. Provisional Application No. 62/740,963 filed on 4 Oct. 2018 under 35 U.S.C. § 119(e), the entire contents of all of which are hereby incorporated by reference.

BACKGROUND

1. Technical Field

The present application relates to a keyboard, particularly to a fixed structure of a keyboard.

2. Description of the Related Art

A keyboard is commonly used in conjunction with a computer as one of the essential input devices in present day. Generally, when most computers and peripheral devices used with computers are developed, lighter, thinner, shorter, and more compact designs are often preferred or required. Keyboards also have been occupying less volume over time. Earlier keyboards were relatively large while thin-film keyboards are very common today. The main structure of a thin-film keyboard includes a base plate, a thin film circuit board and a plurality of keys. In general, the base plate has a flat surface, such that the thin film circuit board can be flatly disposed on the base plate, and a plurality of keys are located on the same horizontal plane.

In order to enhance the user operation experience, a stepped base plate 91 is also available on the market, as shown in FIG. 1. FIG. 1 is a schematic drawing of a prior art keyboard 9 having a stepped base plate 91. In specific, the stepped base plate 91 includes a first part 911 and a second part 912, and the height of the first part 911 is different from the height of the second part 912. Moreover, specific keys 92 such as function (Fn) keys and parts of modifier keys are disposed at the first part 911, which is higher; the other keys 92 are disposed at the second part 912, which is lower. The function (Fn) keys and parts of modifier keys are located in a horizontal plane different from the horizontal plane in which the other keys 92 (most of the keys 92) are located, thereby enhancing the user operation experience. In addition, the bottom of the first part 911 can provide additional space for disposing heat dissipation components and/or electronic components, etc. so as to further increase the durability and improve the functionality of the keyboard 9.

A thin film circuit board 93 has to be disposed at the bottom of the keys 92 to transmit a trigger signal, whether the keys 92 are located at the first part 911 or the second part 912. In the prior arts, the thin film circuit board 93 is divided into multiple regions. For example, a first region 931 is disposed on the first part 911; a second region 932 is disposed on the second part 912. Moreover, a connecting portion 931 (i.e. the configuration of tracks) is disposed on an inclined part 913, which is between the first part 911 and the second part 912, to connect the thin film circuit board 93 of different regions. Furthermore, the elasticity of the connecting portion 931 of the thin film circuit board 93 causes the connecting portion 931 to bulge or not to be disposed flat on the inclined part 913 of the base plate 91. Thus, currently, fixing plates 94 are placed on the connecting portion 93 and are riveted to the base plate 91. In other words, an additional assembly step of riveting is required. Therefore, there is room for further improvements in the manufacturing and assembly process of the keyboard.

SUMMARY APPLICATION

In view of the above issues, it is a major objective of the present application to provide a keyboard. The first limiting portion, the second limiting portion and the third limiting portion of the base plate are respectively accommodated in the opening of the thin film circuit board, so as to solve the problem related to complicated manufacturing and assembly process when a connecting portion of the thin film circuit board is fixed by using fixing members in the prior arts.

To achieve the above objective, the present application provides a keyboard, which includes a base plate and a thin film circuit board. The base plate includes a first part, a second part, and an inclined part. The first part includes at least one first limiting portion and at least one second limiting portion. The second part and the first part are parallel to each other. The second part has at least one third limiting portion. The third limiting portion is protruded from the second part. The inclined part is connected to the first part and the second part. The thin film circuit board is disposed on the base plate. The thin film circuit board includes a first region, a second region, and at least one connecting portion. The first region is located at the first part and has at least one opening. The first limiting portion and the second limiting portion are accommodated in the at least one opening. The first limiting portion limits the first region shifting along a first direction, and the second limiting portion limits the first region shifting along a second direction. The first direction is opposite to the second direction. The second region is located at the second part and has at least one opening. The connecting portion is located at the inclined part. The third limiting portion is passed through the opening of the second region and propped against the connecting portion.

According to an embodiment of the present application, the first limiting portion and the second limiting portion are accommodated in the same opening of the first region, and the first limiting portion and the second limiting portion are respectively propped against the opposite sides of the opening of the first region.

According to an embodiment of the present application, the first region has a plurality of the openings, including at least one first opening and at least one second opening. The first limiting portion is accommodated in the first opening, and the second limiting portion is accommodated in the second opening.

According to an embodiment of the present application, the first opening is a closed opening, the first limiting portion is propped against the side of the first opening close to the connecting portion.

According to an embodiment of the present application, the second opening is an open-type opening facing toward the connecting portion, and the second limiting portion is propped against an inner side of the second opening.

According to an embodiment of the present application, the first limiting portion is a hook, and the lower surface of the hook faces toward the first region of the thin film circuit board.

According to an embodiment of the present application, the inclined part has a hollow portion, and the hollow portion is communicated with the lower surface of the hook.

According to an embodiment of the present application, the first part includes at least one extended portion, and the extended portion extends toward the second part and is adjacent to the hollow portion. The extended portion is protruded from the inclined part and the hollow portion.

According to an embodiment of the present application, the first part includes at least one extended portion, and the extended portion extends from the second part and is protruded from the inclined part.

According to an embodiment of the present application, a lower surface of the extended portion is propped against a part of the connecting portion of the thin film circuit board, and is propped against a top surface of the connecting portion.

According to an embodiment of the present application, the second limiting portion is a protruding element, and the protruding element is protruded from an upper surface of the first part.

According to an embodiment of the present application, the opening of the second region is a third opening, and the third opening is an open-type opening.

According to an embodiment of the present application, the third limiting portion is extended from the second part toward the first part and the inclined part.

According to an embodiment of the present application, third limiting portion is a protruding element, and the protruding element is protruded from an upper surface of the second part.

According to an embodiment of the present application, the first part has a height difference with the second part, and the first part is higher than the second part.

As described above, according to the keyboard of the present application, the first limiting portion and the second limiting portion of the base plate are accommodated in the opening of the thin film circuit board to limit the first region of the thin film circuit board from shifting toward the first direction and the second direction. Moreover, the first direction and the second direction are opposite to each other. Through the foregoing structural design, the thin film circuit board can be fixed to the base plate. Further, the third limiting portion of the base plate can be passed through the opening of the thin film circuit board and propped against the connecting portion. This design prevents the connecting portion from bouncing up due to its own elasticity. Therefore, by the design of the (first, second, and third) limiting portions of the base plate and the openings of the thin film circuit board in the present application, the effect of fixing the thin film circuit board can be achieved without using other fixing members, and the manufacturing and assembly process can be simplified.

DETAILED DESCRIPTION OF THE PREFERRED EMBODIMENT

Hereafter, the technical content of the present application will be better understood with reference to preferred embodiments.

Figure 1:
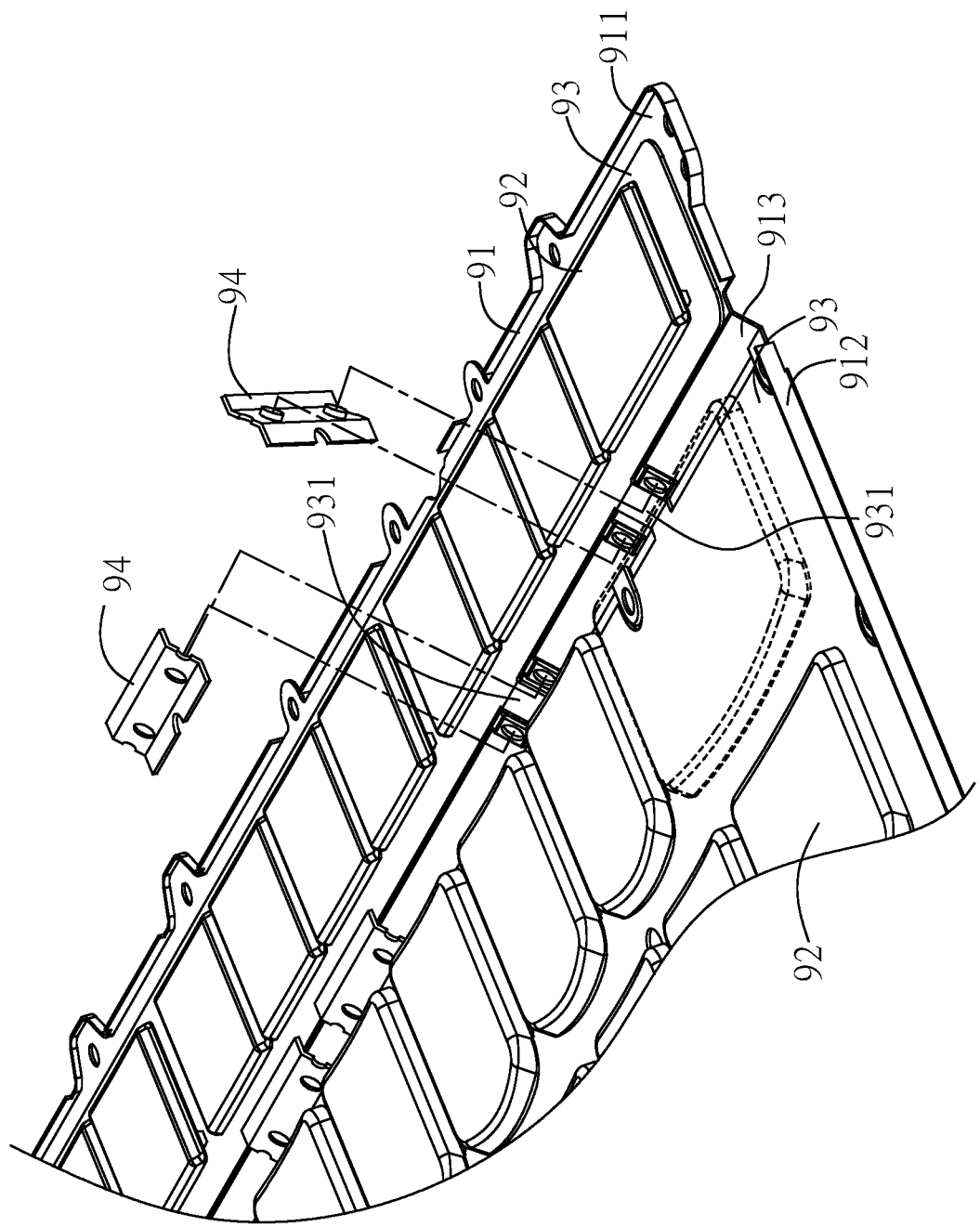
FIG. 1 is a schematic drawing of a prior art keyboard having a stepped base plate.
Figure 2:
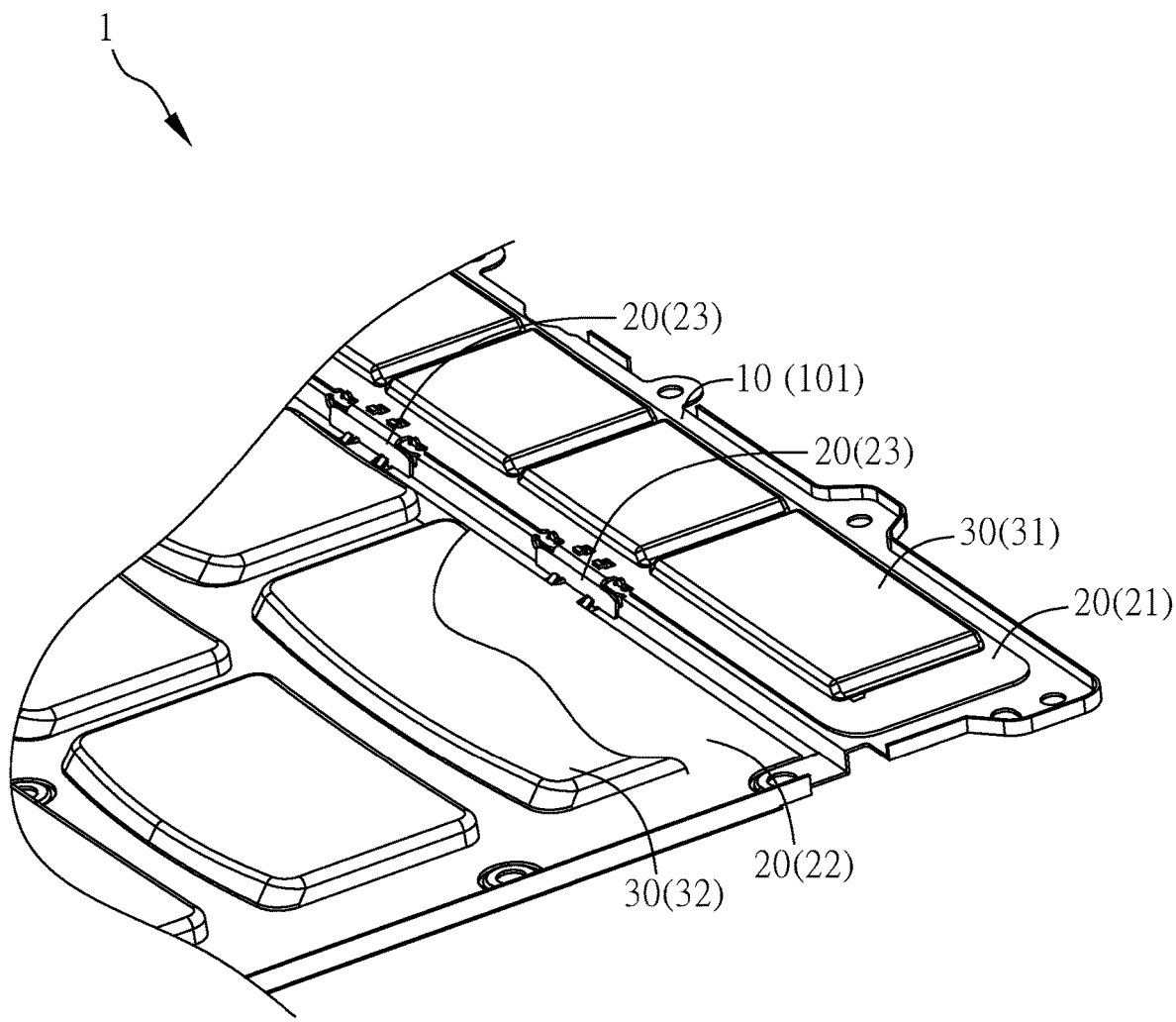
FIG. 2 is a partial schematic view of a keyboard in an embodiment of the present application.
Figure 3A:
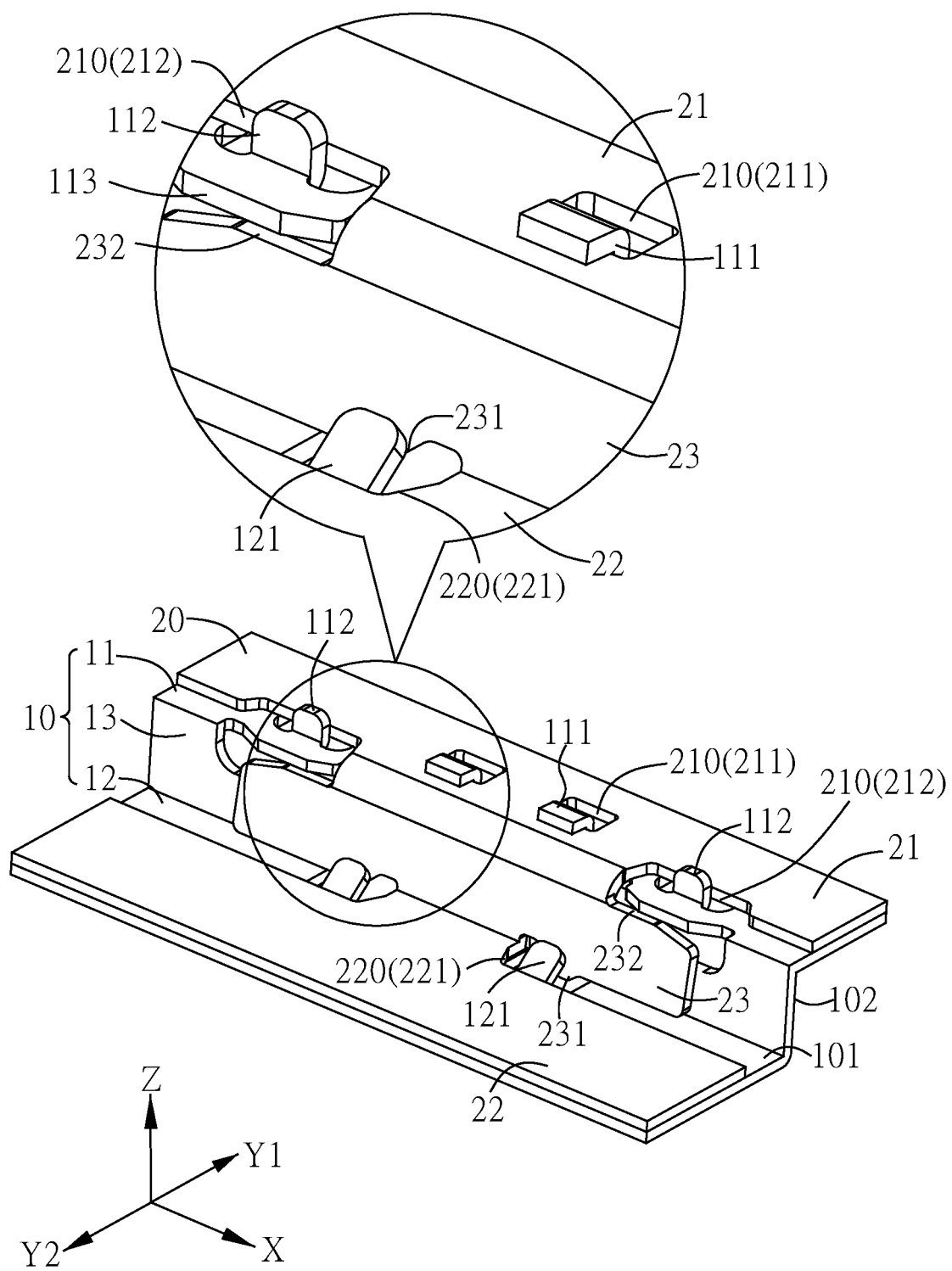
FIG. 3A is a partially enlarged schematic drawing of the base plate and the thin film circuit board shown in FIG. 2.
Figure 3B:
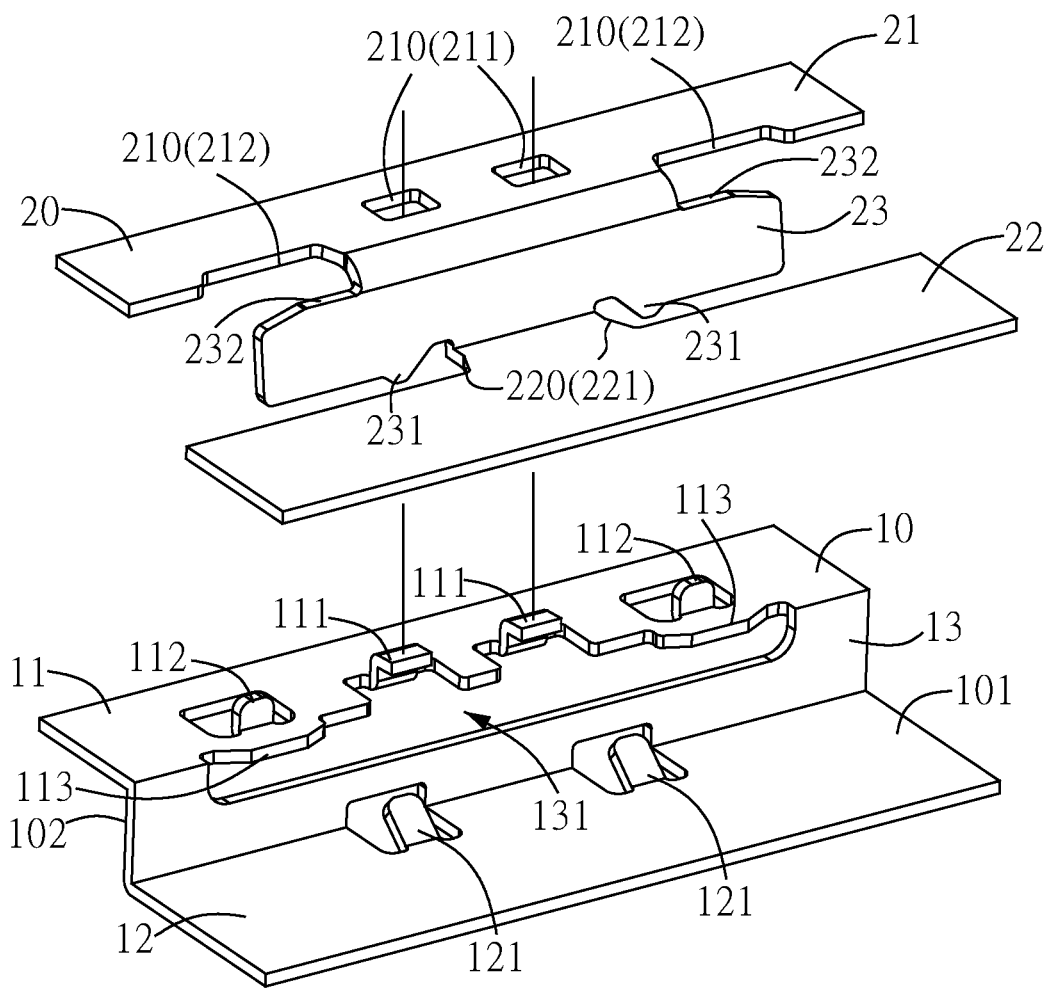
FIG. 3B is an exploded view of the base plate and the thin film circuit board shown in FIG. 3A.

FIG. 2 is a partial schematic view of a keyboard in an embodiment of the present application; FIG. 3A is a partially enlarged schematic drawing of the base plate and the thin film circuit board shown in FIG. 2; and FIG. 3B is an exploded view of the base plate and the thin film circuit board shown in FIG. 3A. Referring to FIG. 2 and FIGS. 3A and 3B, in the present embodiment, a keyboard 1 includes a base plate 10 and a thin film circuit board 20. The main structure of the base plate 10 includes a first part 11, a second part 12 and an inclined part 13. The inclined part 13 is connected to the first part 11 and the second part 12. Specifically, the base plate 10 in the present embodiment is a stepped structure having the first part 11 and the second part 12 with different heights. That is, the first part 11 and second part 12 have a height difference, and the first part 11 of the present embodiment is higher than the second part 12. Furthermore, the second part 12 and the first part 11 are parallel to each other, and the first part 11 and the second part 12 are connected to each other by the inclined part 13. The inclined part 13 in the present embodiment is a vertical plane, as shown in FIGS. 3A and 3B. In other embodiments, the inclined part 13 may also be other relatively gentle slopes, but the present application is not limited thereto.

In the present embodiment, the thin film circuit board 20 is disposed on a base plate 10. To clearly illustrate the embodiment, the opposite surfaces of the base plate 10 in the present embodiment are referred to as an upper surface 101 and a lower surface 102, respectively, that is, the base plate 10 has the upper surface 101 and the lower surface 102 opposite to each other, and the thin film circuit board 20 is disposed on the upper surface 101. Further, the thin film circuit board 20 is divided into a first region 21, a second region 22 and at least one connecting portion 23. The first region 21 is located at the first part 11, the second region 22 is located at the second part 12, and the connecting portion 23 is located in the inclined part 13.

In the present embodiment, the keyboard 1 also includes a plurality of keys 30. Some of the keys 30 are disposed in the first part 11 of the base plate 10, and some of the keys 30 are disposed in the second part 12. For example, modifier keys 31, such as function keys (Fn keys), are disposed in the first part 11, and regular keys 32 are disposed in the second part 12. The first region 21 of the thin film circuit board 20 is used to generate and transmit a trigger signal of the modifier key 31, and the second region 22 is used to generate and transmit a trigger signal of the regular keys 32. The first region 21 and the second region 22 are connected by the connecting portion 23. In other words, the tracks (the connecting portion 23) are configured at the inclined part 13 such that the circuits of the first region 21 and the second region 22 are connected by the connecting portion 23. Moreover, the present application does not limit the number of the connecting portion 23. For example, a connecting portion 23 may correspond to a single modifier key 31, or a connecting portion 23 may correspond to two to three modifier keys 31, but the present application is not limited thereto.

In the present embodiment, the base plate 10 includes a plurality of limiting portions. The thin film circuit board 20 has a plurality of openings (which may be closed-type openings or open-type openings). Accordingly, the limiting portion can be passed through the opening to fasten the thin film circuit board. In specific, the first part 11 includes at least one first limiting portion 111 and at least one second limiting portion 112, and the second part 12 includes at least one third limiting portion 121. Preferably, the first limiting portion 111, the second limiting portion 112 and the third limiting portion 121 are disposed close to the connecting portion 23. A group of each connecting part 23 is taken as an example, as shown in FIGS. 3A and 3B. The first part 11 in the present embodiment includes two first limiting portions 111 and two second limiting portions 112, and the second part 12 has two third limiting portions 121.

Correspondingly, the first region 21 has an at least one opening 210, and the second region 22 has an at least one opening 220, which is referred to herein as a third opening 221. Further, a group of each of the connecting portions 23 is taken as an example. The first region 21 in the present embodiment has four openings 210, and the two openings 210 for accommodating the first limiting portion 111 are referred to as the first opening 211, and the two openings 210 for accommodating the second limiting portion 112 are referred to as the second opening 212. In other words, the first region 21 in the present embodiment has four openings 210 including the two first openings 211 and the two second openings 212, and the first limiting portion 111 is accommodated in the first opening 211, and the second limiting portion 112 is accommodated in the second opening 212. In the present embodiment, the thin film circuit board 20 has a plurality of openings (including the opening 210 of the first region 21 and the opening 220 of the second region 22), and the openings for accommodating the first limiting portion 111, the second limiting portion 112, or the third limiting portion 121 are respectively referred to as the first opening 211, the second opening 212 and the third opening 221.

In the present embodiment, the first opening 211 may be a closed opening, and the second opening 212 and the third opening 221 may be open-type openings. It should be noted that the closed opening (i.e. the first opening 211) is a complete hole, and the open-type opening (i.e. the second opening 212 and the third opening 221) is a notch which is partially communicated with the outside.

The first limiting portion 111 may be a protruding element or a hook. The first limiting portion 111 is propped against the side of the first opening 211 close to the connecting portion 23. Accordingly, the first limiting portion 111 limits the first region 21 from shifting or moving toward a first direction Y1. Taking the viewing angle of FIG. 3A as an example, the first limiting portion 111 is propped against the front side of the first opening 211. This prevents the first region 21 from shifting or moving backward (in the first direction Y1).

Furthermore, the second limiting portion 112 in the present embodiment is a protruding element, which is protruded from the upper surface 101 of the first part 11. Also, the second limiting portion 112 in the present embodiment is a plate structure. The second limiting portion 112 is propped against an inner side of the second opening 212, that is, a side close to the connecting portion 23. Accordingly, the second limiting portion 112 limits the first region 21 from shifting toward the second direction Y2. Similarly, taking the viewing angle of FIG. 3A as an example, the second limiting portion 112 can prevent the first region 21 from shifting forward (in the second direction Y2). In other words, the first limiting portion 111 and the second limiting portion 112 respectively restrict the first region 21 from shifting toward the first direction Y1 and the second direction Y2, where the first direction Y1 is opposite to the second direction Y2.

In specific, the keyboard 1 has a long axis direction X, the first direction Y1, and the second direction Y2 that is in the same plane (XY plane) with the long axis direction X. Also, the first direction Y1 and the second direction Y2 are perpendicular to the long axis direction X.

In other embodiments, the second opening 212 may also be a closed opening, and the second limiting portion 112 is propped against the rear side of the second opening 212, that is, away from the side of the connecting portion 23. The effect of limiting the first region 21 from shifting toward the second direction Y2 may be achieved. The present application does not limit the configuration and number of the first limiting portion 111, the second limiting portion 112, and the opening 210 (including the first opening 211 and the second opening 212). It is only necessary to have the first limiting portion 111 to limit the first region 21 from shifting toward the first direction Y1, and have the second limiting portion 112 to limit to the first region 21 from shifting toward a second direction Y2. Hereafter, other embodiments are used for further illustration of other aspects.

Preferably, the first limiting portion 111 in the present embodiment may be a hook, which is protruded from the first part 11, and the lower surface 102 of the hook (the first limiting portion 111) faces toward the first region 21 of the thin film circuit board 20. With the foregoing structure, the first region 21 can be restricted from shifting or moving in a third direction Z. The third direction Z is perpendicular to a plane (XY plane) formed by the first direction Y1 (or the second direction Y2) and the long axis direction X. In other words, the first limiting portion 111 of the hook configuration may limit the first region 21 from shifting or moving in the first direction Y1, and may also limit the first region 21 from shifting or moving in the vertical direction (the third direction Z).

The third limiting portion 121 is protruded from the second part 12. In the present embodiment, the third limiting portion 121 is protruded from the second part 12 and extended toward the first part 11 and the inclined part 13 to form an inclined plate as shown in FIGS. 3A and 3B. The second region 22 includes at least one opening 220. In the present embodiment, two third openings 221 are used for illustration. The third limiting portion 121 can be passed through from the third opening 221 of the second region 22 to the outside of the connecting portion 23, and further propped against the outside of the connecting portion 23. Thus, the connecting portion 23 is close to the inclined part 13 of the base plate 10, and the connecting portion 23 is fixed. This prevents the connecting portion 23 from moving forward (in the second direction Y2) due to its own elastic force. As described above, the third opening 221 of the present embodiment may be an open-type opening.

Preferably, the lower edge of the connecting portion 23 can be extended downward to form two protruding elements 231. Moreover, the position of the protruding elements 231 eccentrically corresponds to the free end of the third limiting portion 121. Thus, the third limiting portion 121 can be directly propped against the protruding elements 231, to enhance the effect of preventing the connecting portion 23 from bulging forward (in the second direction Y2). In other embodiments, the third opening 221 may also be a closed opening, and the third limiting portion 121 is propped against the third opening 221. The present application does not limit the configuration and number of the third limiting portion 121 and the third opening 221.

In the present embodiment, the two first limiting portions 111 are located close to the center of the connecting portion 23, and the second limiting portions 112 are located on the opposite two sides of the first limiting portion 111, that is, close to the two sides of the connecting portion 23. Preferably, the first part 11 includes at least one extended portion 113. In the present embodiment, two extended portions 113 are used as example. They are respectively located at the front end of the second limiting portion 112. Further, the extended portions 113 are extended toward the second part 12, that is, extended forward (in the second direction Y2). Thus, the extended portions 113 to be protruded from the inclined part 13. When the thin film circuit board 20 is mounted on the base plate 10, the extended portions 113 are located at the upper edge of the two sides of the connecting portion 23, such that the lower surface 102 of the extended portions 113 is propped against a part of the connecting portion 23 and propped against the top surface 232 of the connecting portion 23. Accordingly, with the design of the extended portions 113, the connecting portion 23 could be prevented from shifting or moving in the third direction Z, that is, to prevent the connecting portion 23 from bulging up.

Preferably, the inclined part 13 in the present embodiment includes a hollow portion 131. The hollow portion 131 is communicated with the lower surface 102 of the hook (the first limiting portion 111). Also, the extended portion 113 of the first part 11 is adjacent to the hollow portion 131. That is, the hollow portion 131 is extended to the lower edge of the extended portion 113, and the extended portion 113 is protruded from the inclined part 13 and the hollow portion 131. When the thin film circuit board 20 is mounted on the base plate 10, the first opening 211 can be first placed into the hook (the first limiting portion 111). With the design of the hollow portion 131, the upper edge of the connecting portion 23 can sink into the hollow portion 131. This is more advantageous for the lower surface 102 of the extended portion 113 to be propped against the top surface 232 of the connecting portion 23.

Figure 4A:
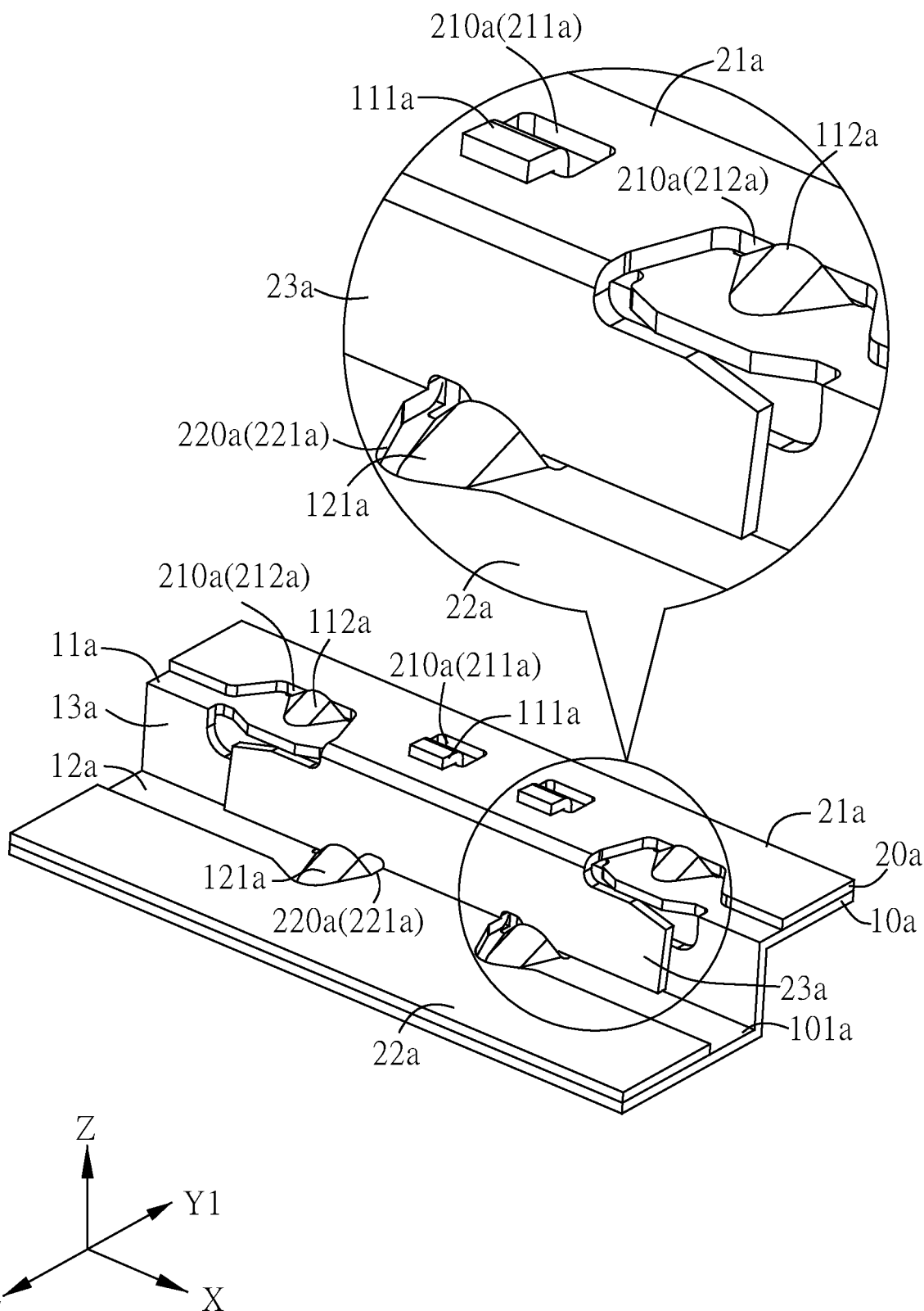
FIG. 4A is a partially enlarged schematic drawing of a base plate and a thin film circuit board in a second embodiment of the present application.
Figure 4B:
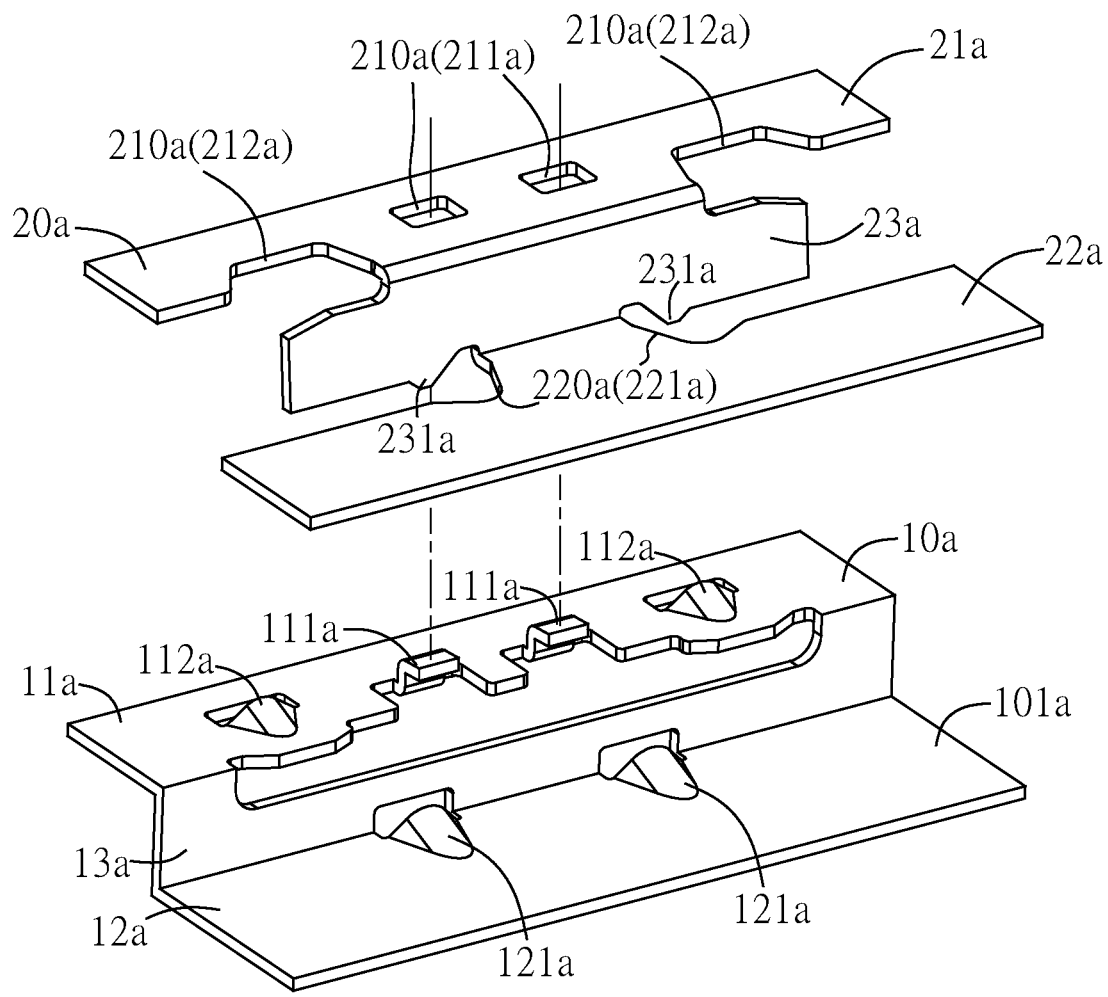
FIG. 4B is an exploded view of the base plate and the thin film circuit board shown in FIG. 4A.

The present application does not limit the configuration of the first limiting portion 111, the second limiting portion 112, and the third limiting portion 121. As described above, the first limiting portion 111 may be a protruding element or a hook. Hereafter, the second embodiment is used to illustrate the second limiting portion 112a and the third limiting portion 121a of other configurations. FIG. 4A is a partially enlarged schematic drawing of a base plate and a thin film circuit board in a second embodiment of the present application; FIG. 4B is an exploded view of the base plate and the thin film circuit board shown in FIG. 4A. Please refer to both FIG. 4A and FIG. 4B.

The similarity between the first limiting portion 111a and the second limiting portion 112a is that the first limiting portion 111a and the second limiting portion 112a are accommodated in the first opening 211a and the second opening 212a, respectively, and the first limiting portion 111a is also a hook structure. The difference is that the second limiting portion 112a and the third limiting portion 121a are tapered-like protruding elements. Specifically, the second limiting portion 112a is a protruding element protruding from the upper surface 101a of the first part 11a, and the third limiting portion 121a is a protruding element protruding from the upper part 101a of the second part 12a. One surface of the second limiting portion 112a is propped against the inner side of the second opening 212a, to limit the first region 21 from shifting toward the second direction Y2. One surface of the third limiting portion 121a is propped against the protruding element 231a of the connecting portion 23a, to avoid the connecting portion 23a moving forward (in the second direction Y2) due to its own elasticity. For other structural designs of the base plate 10a and the thin film circuit board 20a, refer to the base plate 10 and the thin film circuit board 20 in the first embodiment, which are not described herein.

Figure 5:
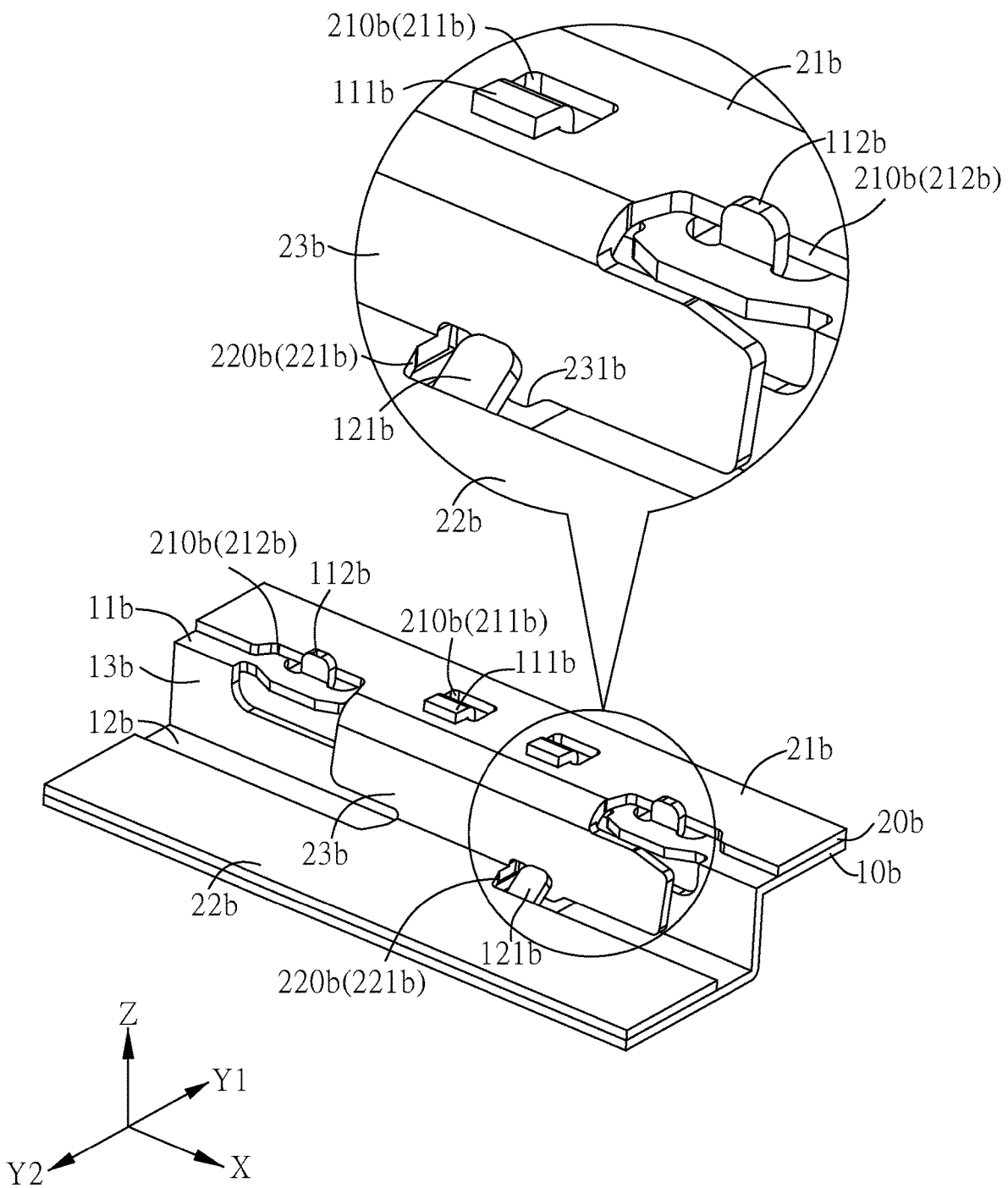
FIG. 5 is a partially enlarged schematic drawing of a base plate and a thin film circuit board in a third embodiment of the present application.

The present application also does not limit the number of the third limiting portion 121. Hereafter a third embodiment is used for illustration. FIG. 5 is a partially enlarged schematic drawing of the base plate and the thin film circuit board in the third embodiment of the present application. Referring to FIG. 5, in the present embodiment, the second part 12b of the base plate 10b may include a third limiting portion 121b. Correspondingly, only one lower edge of the connecting portions 23b is extended to form a protruding element 231b. Thus the third limiting portion 121b can be propped against the protruding element 231b, to prevent the connecting portion 23b from moving forward (in the second direction Y2) due to its own elasticity. For other structural designs of the base plate 10b and the thin film circuit board 20b, refer to the base plate 10 and the thin film circuit board 20 in the first embodiment, which are not described herein.

Figure 6:
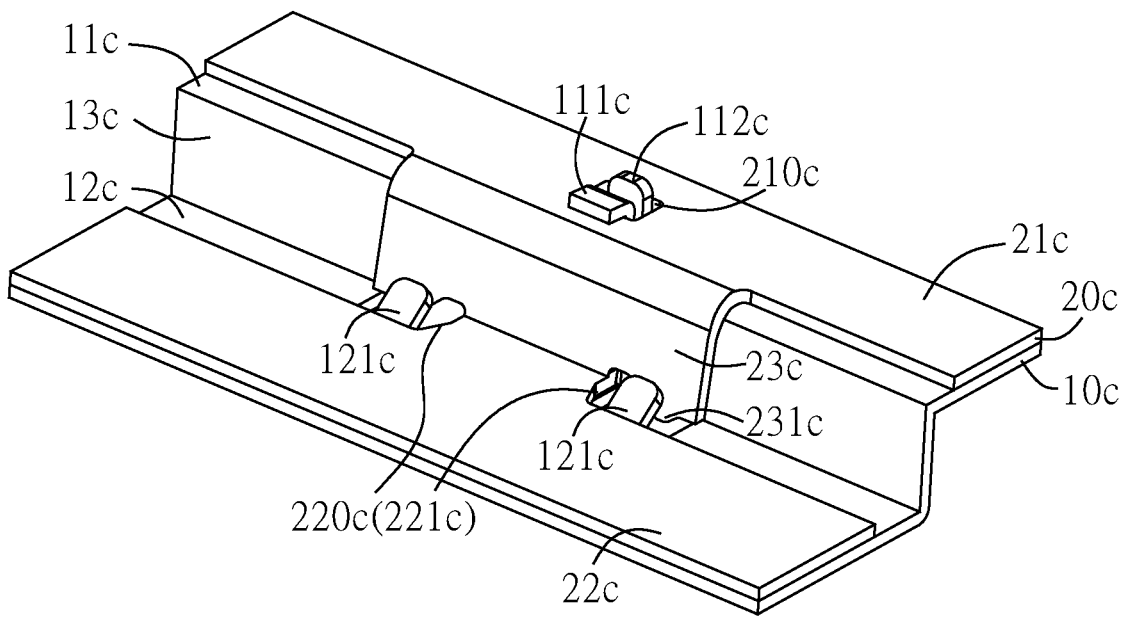
FIG. 6 is a partially enlarged schematic drawing of a base plate and a thin film circuit board in a fourth embodiment of the present application.

In addition, the present application also does not limit the number of openings 210 of the first region 21 of the thin film circuit board 20. Hereafter the fourth embodiment is used for illustration. FIG. 6 is a partially enlarged schematic drawing of the base plate and the thin film circuit board in the fourth embodiment of the present application. Referring to FIG. 6, in the present embodiment, a group of each connecting portion 23 is taken as an example. The first region 21c may have only one opening 210c, and it is a closed opening. Correspondingly, the first part 11c of the base plate 10c includes a first limiting portion 111c and a second limiting portion 112c. The first limiting portion 111c and the second limiting portion 112c are both accommodated in the same opening 210c. The first limiting portion 111c and the second limiting portion 112c respectively are propped against opposite sides of the opening 210c. In the present embodiment, the first limiting portion 111c is propped against the front side of the opening 210c (close to the side of the connecting portion 23c) to prevent the first region 21c from shifting or moving backward (in the first direction Y1). The second limiting portion 112c is propped against the rear side of the opening 210c (away from the side of the connecting portion 23c) to prevent the first region 21c from shifting or moving forward (in the second direction Y2).

As described above, according to the keyboard of the present application, the first limiting portion and the second limiting portion of the base plate are accommodated in the opening of the thin film circuit board to limit the first region of the thin film circuit board from shifting toward the first direction and the second direction. Moreover, the first direction and the second direction are opposite to each other. Through the foregoing structural design, the thin film circuit board can be fixed to the base plate. Further, the third limiting portion of the base plate is passed through the opening of the thin film circuit board and propped against the connecting portion. This design prevents the connecting portion from bouncing up due to its own elasticity. Therefore, by the design of the (first, second, and third) limiting portions of the base plate and the openings of the thin film circuit board in the present application, the effect of fixing the thin film circuit board can be achieved without using other fixing members, and the manufacturing and assembly process can be simplified.

It should be noted that the described embodiments are only for illustrative and exemplary, and that various changes and modifications may be made to the described embodiments without departing from the scope of the application as disposed by the appended claims.

What is claimed is:

1. A keyboard, comprising:
   a base plate, comprising:
   a first part, including at least one first limiting portion and at least one second limiting portion;
   a second part, which is parallel to the first part and has at least a third limiting portion protruding from the second part; and
   an inclined part, which is connected to the first part and the second part; and
   a thin film circuit board, which is disposed on the base plate, the thin film circuit board comprising:
   a first region, which is located at the first part, the first region having at least one opening, the first limiting portion and the second limiting portion being accommodated in the at least one opening, the first limiting portion limiting the first region shifting along a first direction, the second limiting portion limiting the first region shifting along a second direction, the first direction being opposite to the second direction;
   a second region, which is located at the second part and has at least one opening; and
   at least one connecting portion, which is located at the inclined part, the third limiting portion being passed through the opening of the second region and propped against the connecting portion.

2. The keyboard as claimed in claim 1, wherein the first limiting portion and the second limiting portion are accommodated in the same opening of the first region, and the first limiting portion and the second limiting portion are respectively propped against the opposite sides of the opening of the first region.

3. The keyboard as claimed in claim 1, wherein the first region includes a plurality of the openings, including at least one first opening and at least one second opening, the first limiting portion is accommodated in the first opening, and the second limiting portion is accommodated in the second opening.

4. The keyboard as claimed in claim 3, wherein the first opening is a closed opening, and the first limiting portion is propped against the side of the first opening close to the connecting portion.

5. The keyboard as claimed in claim 3, wherein the second opening is an open-type opening facing toward the connecting portion, and the second limiting portion is propped against an inner side of the second opening.

6. The keyboard as claimed in claim 1, wherein the first limiting portion is a hook, and a lower surface of the hook faces toward the first region of the thin film circuit board.

7. The keyboard as claimed in claim 6, wherein the inclined part includes a hollow portion, and the hollow portion is communicated with the lower surface of the hook.

8. The keyboard as claimed in claim 7, wherein the first part includes at least one extended portion, the extended portion extends toward the second part and is adjacent to the hollow portion, and the extended portion is protruded from the inclined part and the hollow portion.

9. The keyboard as claimed in claim 8, wherein a lower surface of the extended portion is propped against parts of the connecting portion of the thin film circuit board, and is propped against a top surface of the connecting portion.

10. The keyboard as claimed in claim 1, wherein the first part includes at least one extended portion, and the extended portion extends toward the second part and is protruded from the inclined part.

11. The keyboard as claimed in claim 10, wherein a lower surface of the extended portion is propped against a part of the connecting portion of the thin film circuit board, and is propped against a top surface of the connecting portion.

12. The keyboard as claimed in claim 1, wherein the second limiting portion is a protruding element, and the protruding element is protruded from an upper surface of the first part.

13. The keyboard as claimed in claim 1, wherein the opening of the second region is a third opening that is an open-type opening.

14. The keyboard as claimed in claim 1, wherein the third limiting portion is extended from the second part toward the first part and the inclined part.

15. The keyboard as claimed in claim 1, wherein the third limiting portion is a protruding element, and the protruding element is protruded from an upper surface of the second part.

16. The keyboard as claimed in claim 1, wherein the first part has a height difference with the second part, and the first part is higher than the second part.

* * * * *